United States Patent [19]

Ohno

[11] Patent Number: 5,704,059

[45] Date of Patent: Dec. 30, 1997

[54] METHOD OF WRITE TO GRAPHIC MEMORY WHERE MEMORY CELLS DESIGNATED BY PLURALITY OF ADDRESSES SELECTED SIMULTANEOUSLY FOR ONE ROW ADDRESS ARE WRITTEN

[75] Inventor: Kazuki Ohno, Tokyo, Japan

[73] Assignee: NEC Corporation, Tokyo, Japan

[21] Appl. No.: 683,218

[22] Filed: Jul. 18, 1996

[30] Foreign Application Priority Data

Jul. 28, 1995 [JP] Japan .................................. 7-193553

[51] Int. Cl.$^6$ .............................. G06F 12/06; G06F 13/00
[52] U.S. Cl. .................... 395/515; 395/517; 395/523; 345/119; 345/191
[58] Field of Search .......................... 395/515, 517, 395/523, 525; 345/113, 118, 119, 120, 189–191

[56] References Cited

U.S. PATENT DOCUMENTS

| 4,546,451 | 10/1985 | Bruce | 395/517 |
| 5,029,105 | 7/1991 | Coleman et al. | 395/515 |
| 5,119,331 | 6/1992 | Sussman | 365/189.01 |
| 5,131,080 | 7/1992 | Fredrickson et al. | 345/190 |
| 5,235,545 | 8/1993 | McLaury | 365/189.04 |
| 5,251,296 | 10/1993 | Rhoden et al. | 395/517 |
| 5,422,998 | 6/1995 | Margolin | 395/519 |

OTHER PUBLICATIONS by Samsung Corp., "KM4132G271", *CMOS SGRAM*, Aug. 1995, pp. 15–18.

*Primary Examiner*—Mark R. Powell
*Assistant Examiner*—U. Chauhan
*Attorney, Agent, or Firm*—Young & Thompson

[57] ABSTRACT

In a method of write to a graphic memory where memory cells designated by a plurality of addresses selected simultaneously for one ROW address, the present method of write includes a first step of dividing the area corresponding to the column addresses designated by one row address of a memory cell array in to a plurality of segments each consisting of an arbitrary number of column addresses, a second step of designating a start address and an end address for each of the plurality of segments based on a first piece of information of column information, a third step of specifying the section designated by the start address and the end address as the candidate for the write object areas, and a fourth step of selecting segments having write object areas based on a second piece of information of the column address information, and writing specified data to the candidate for the write object areas of the segments having the write object areas.

3 Claims, 4 Drawing Sheets

METHOD OF WRITE TO GRAPHIC MEMORY WHERE MEMORY CELLS DESIGNATED BY PLURALITY OF ADDRESSES SELECTED SIMULTANEOUSLY FOR ONE ROW ADDRESS ARE WRITTEN

BACKGROUND OF THE INVENTION

The present invention relates to a write method to a graphic memory, and more particularly, to a write method to a graphic memory in which rectangular areas for displaying windows or the like are painted out into specified patterns.

A video RAM (VRAM) or a graphic RAM (GRAM) in a small-sized computer such as an EWS or a personal computer is interposed between a CPU and a display. Read-in and read-out of display data for a memory of such a device are controlled by the CPU.

Besides, a method is employed in which a plurality of jobs are carried out or one job is carried out while referring to plural pieces of information, by using a single display. For such a purpose, the so-called multi-window display is employed in which a plurality of screens with various sizes are displayed simultaneously on one display screen. Each of these screens called a window is painted out with specified data, for example, color data of gray. In order to efficiently write data to the area to be painted out in a window, a write method known as block write, as described in a data sheet disclosed by Samsung Corp. in August, 1995, is employed. Normally, in a dynamic RAM (DRAM), a method is employed in which data are written to a single memory cell designated by a row address and a column address. In contrast, the block write method is a method in which, for the VRAM or GRAM, a plurality of column addresses are selected simultaneously for one row address, and the same data are written to the corresponding memory cells. Referring to the drawings, the block write method will be described in the following.

FIG. 3 is a diagram showing a portion of a general graphic display screen. In the figure, X direction is the horizontal scanning direction and Y direction is the vertical scanning direction. Areas 11, 12 and the like surrounded by the broken lines indicate areas corresponding to one row address in the memory. The area 11 is constituted of four horizontal scanning lines consisting of 64 pixels indicated by column addresses 0 to 63, namely, pixel numbers 0 to 63 as shown in FIG. 5(A), or of 8 horizontal scanning lines consisting of 32 pixels indicated by the pixel numbers 0 to 31 as shown in FIG. 5 (B).

FIGS. 6(A) and 6(B) are schematic diagrams which shows the expansion of the display screens of FIGS. 5(A) and 5(B), respectively, into the actual memory arrangement conditions. The memory area of FIG. 6(A) consists of one row address and column addresses of 0 to 255, where the column addresses 0–63, 64–127, 128–191 and 192–255 store data corresponding to the horizontal scanning lines 101, 102, 103 and 104, respectively, of the display screen areas 11 in FIG. 5(A). The column addresses 0 to 255 of the memory areas in FIG. 6(B) are subdivided into column addresses 0–31, 32–63, 64–95, 96–127, 128–191, 192–223 and 224–255, and store data corresponding to the respective horizontal scanning lines 201 to 208 of the display screen area 11 in FIG. 5(B).

As described in the above, the display screen 11 consists of one row address and a plurality of column addresses. Generally, in a DRAM access to the column addresses corresponding to bit line selection is faster than that to the row addresses corresponding to word line selection. One reason for this is that row address selection is carried out through a word line consisting of a polysilicon wire, whereas column address selection is carried out through a bit line consisting of a metallic wiring made of alumnium or the like. Accordingly, since access to a plurality of different column addresses with the same row address can be accomplished fast, when plotting a straight line in an arbitrary direction on the display screen, it is so arranged as to assign it to X and Y areas with the same row address.

When window display which is currently in general use is applied to a graphic device as described in the above, the range of the area 1 in FIG. 3, for example, is painted out in a specified color and pattern. In doing that, the painting-out of the area 1 is carried out by simultaneously writing 4 or 8 column addresses with the same row address, that is, the 4 or 8 pixels using the block write method.

As in the above, by employing the block write method, painting-out for a fixed number of column addresses of 4 or 8, namely, for every 4 or 8 pixels becomes feasible, so that fast write at a speed of 4 or 8 times that of the ordinary write method, in which painting-out is carried out for every column address, becomes possible.

However, among the ranges with the same row address and designated by column addresses of, for example, 4 or 8, there are cases where they have an area which is a write object area and an area which is not a write object area. In such an area where the boundaries of the write object area are deviated from the boundaries of the segments, column mask function is introduced for invalidating the designation of the section of the deviated column addresses to avoid the painting-out of the section. The column mask function is executed by means of mask information, separate from the address information, which is input through data input/output pins.

In recent years, further enhancement of the screen plotting speed is being demanded. The enhancement of the screen plotting speed is related to the enhancement of the write rate to the graphic memory. For this reason, a method of plotting is conceivable by which the column addresses are selected in a unit greater than 4 or 8 units. However, if an attempt is made to increase the simultaneously selected number of column addresses of the block write method, the number of pieces of mask information for column mask function to be used for the case when the boundaries of write object areas deviate from the boundaries of the areas designated for respective 4 or 8 column addresses, needs be increased. Accordingly, it leads to a problem that the number of input/output pin terminals for the mask information becomes a constraint on the enhancement of the performance of the method.

SUMMARY OF THE INVENTION

It is therefore the object of the present invention to increase the speed of writing to a graphic memory without the use of input/output pins for mask information.

The write method to the graphic memory according to this invention is characterized in that it includes a first step of dividing the area of a memory cell array corresponding to column addresses designated by one row address into a plurality of segments consisting of a unit of an arbitrary number of column addresses, a second step of designating a start address and an end address for each of the plurality of segments based on a first piece of information of column address information, a third step of assigning the section designated by the start address and the end address as a candidate for write object areas, and a fourth step of selecting segments having write object areas based on a second piece of information of the column address information, and writing specified data to the candidate write object areas of the segments having the write object regions.

By the use of the above means, start addresses and end addresses which are the same for respective segments are designated. Next, by designating the segments having the write areas, rectangular areas with written data are displayed on the display screen.

BRIEF DESCRIPTION OF THE DRAWINGS

The above and other objects, advantages and features of the present invention will be more apparent from the following description taken in conjunction with the accompanying drawings, in which:

Referring to FIGS. 1, 2A–2J and 3, the present invention will be described in the following. For the convenience of description, it will be assumed that the number of column addresses corresponding to one row address of the memory cell array is 256, and the number of division of these column addresses is 4, that is, the number of segments is 4. This means that one row address corresponds on the display screen to four horizontal scanning lines each containing of 64 pixels. In addition, blocks A1, A2, . . . , and A14 on the display screen in FIG. 3 correspond to the actual memory areas MA1, MA2, . . . , and MA14 in FIGS. 2A–2J, respectively. Here, when areas 1 and 2 are to be painted out, it is obvious that it is necessary to process them according to respective row addresses, that is, according to the blocks A1, A2, . . . , and A14. The write object area on the actual memory of the block A1 corresponds to the hatched portion of the area MA1. Similar situation applies to the other blocks A2 to A14. It is to be noted that the write object areas of the actual memory areas MA1, 4, 7 and 10 are given half the size of a segment SG while the write object areas of the actual memory areas MA3, 6, 9 and 12 are given the size of a quarter of the size of the segment SG.

Next, a method of painting out the block A1 will be described. First, a start address (address indicated by the letter S in FIGS. 2A–2J) and an end addresses (address indicated by the letter E in FIG. 2A–2J) are designated for each of the four segments. The designation method is as follows. FIG. 4 is a diagram showing the column addresses that indicate the start address and the end addresses. These include two kinds of column addresses, namely, a column address Y1 for the start address and a column address Y2 for the end address. It will be assumed here that the column address Y2 for the end address is greater than the column address Y1 for the start address. Since the column addresses corresponding to one row address are 256 in number, each of the column addresses for the start and end addresses are constituted of 8 bits. The column address for the start address are divided into two bits Y1a and Y1b of high order bits and six bits Y1c of low order bits. The column address for the end address is similarly divided into Y2a, Y2b and Y2c. The low bits Y1c and Y2c each consisting of six bits correspond to the column addresses 0 to 63 of respective segments. When the high order two bits Y1a and Y1b of the column address for the start address are "00" (2-bit display), they designate the segment SG1, and when they are "01", "10" and "11", they designate the segments SG2, SG3 and SG4 respectively. Similar thing applies also to the high order two bits Y2a and Y2b of the column address for the end address. Further, the segment selected by the high order two bits of the column address for the start address, the segment selected by the high order two bits of the column address for the end address, and the segments lying between these two segments serve as the segments having the write object areas.

Figure 1:
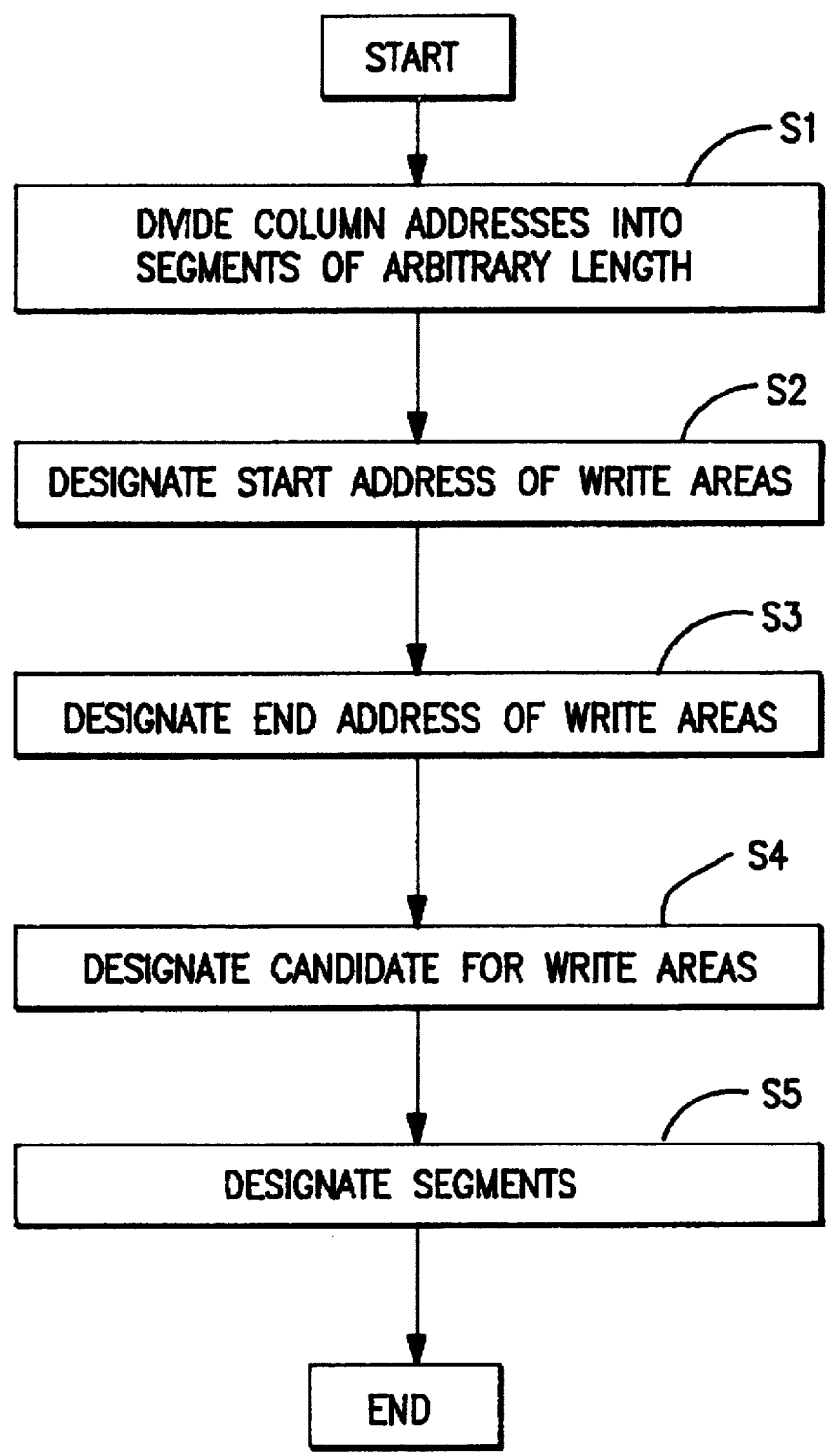
FIG. 1 is a flow chart showing an embodiment mode of write method to a graphic memory according to the invention.
Figure 2A:
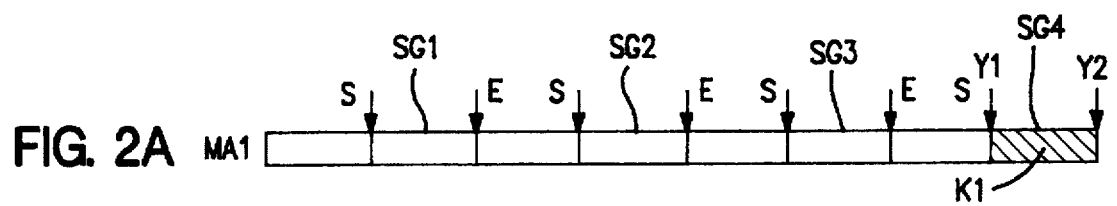
FIGS. 2A–2J give explanatory diagrams schematically showing the conditions of the memory due to the graphic memory write method of this embodiment mode.
Figure 2B:
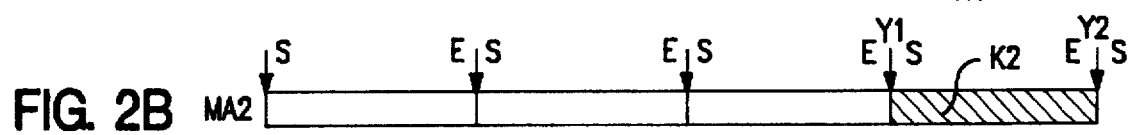
Figure 2C:
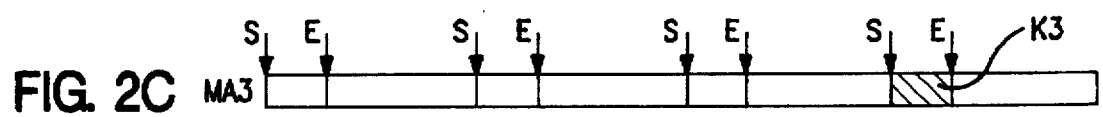
Figure 2D:
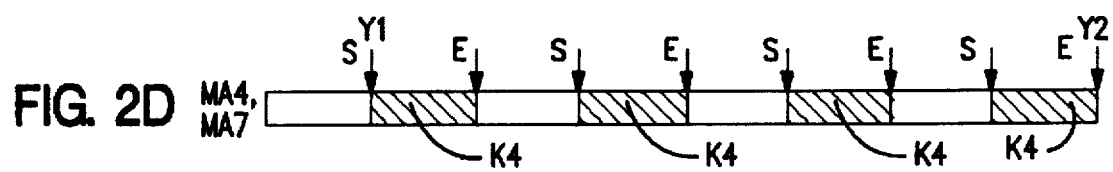
Figure 2E:
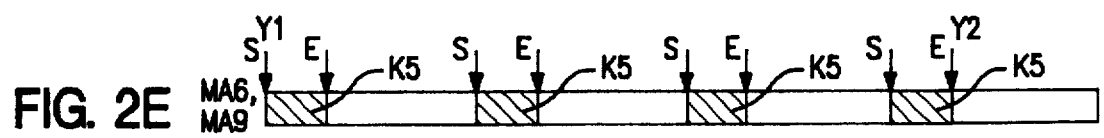
Figure 2F:
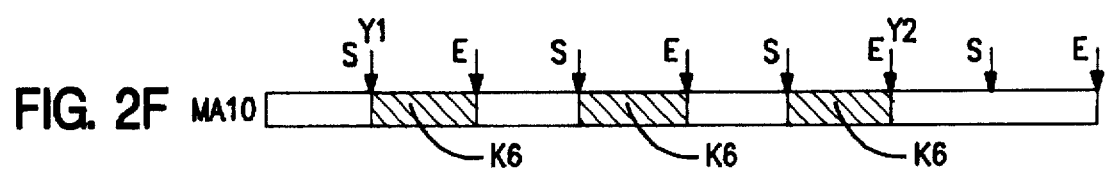
Figure 2G:
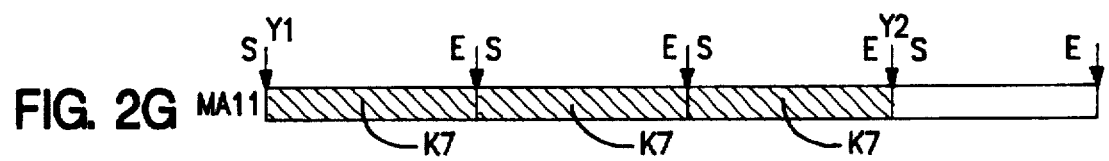
Figure 2H:
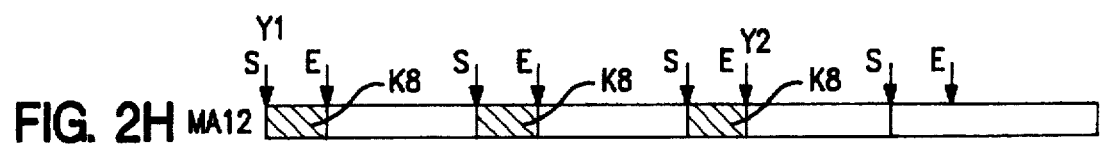
Figure 2I:
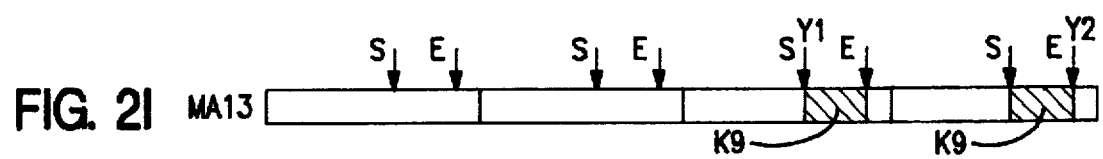
Figure 2J:
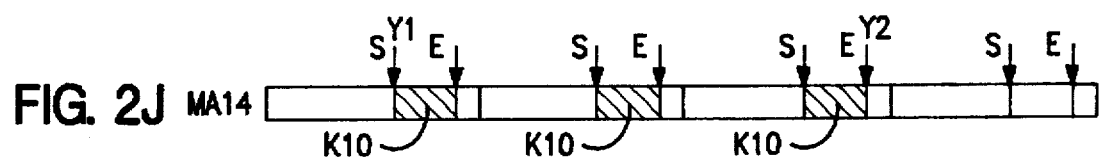
Figure 3:
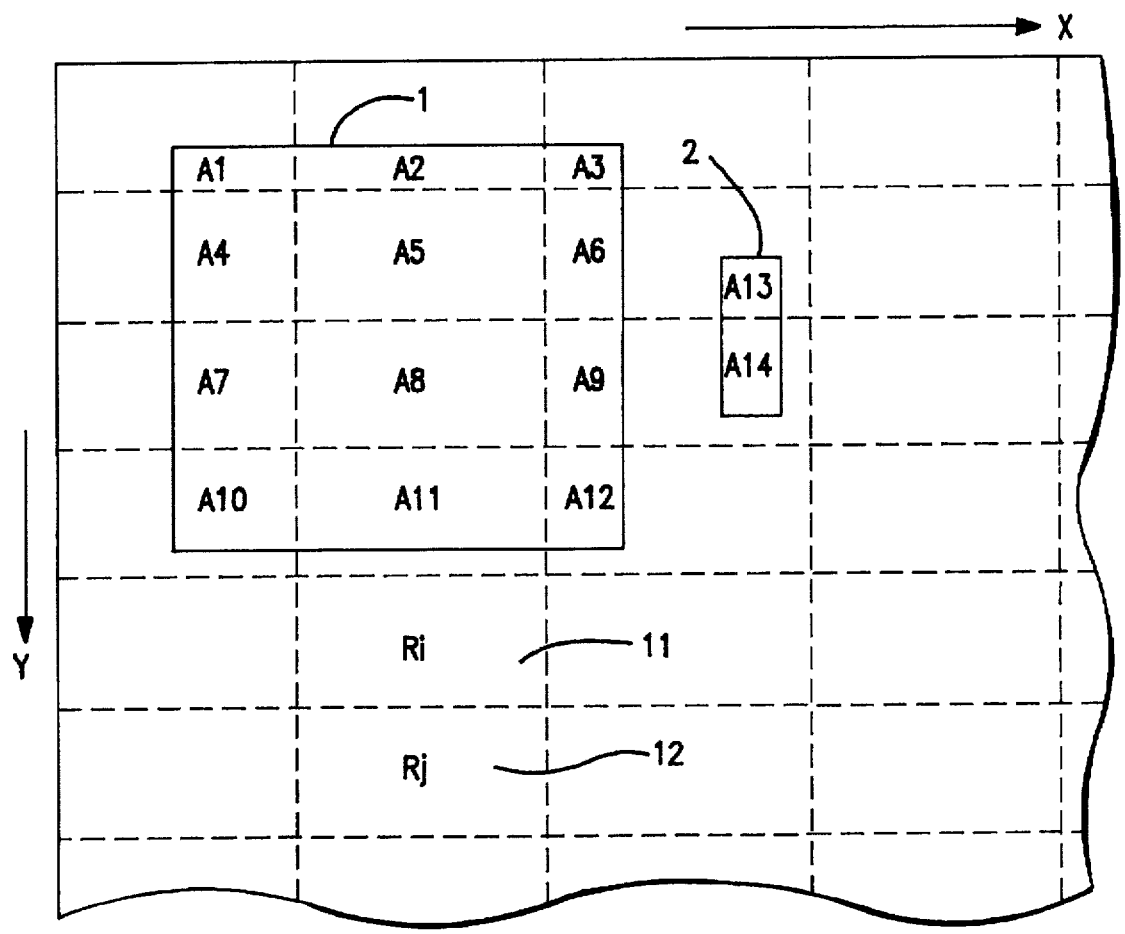
FIG. 3 is an explanatory diagram schematically showing a portion of a general graphic display screen.
Figure 4A:
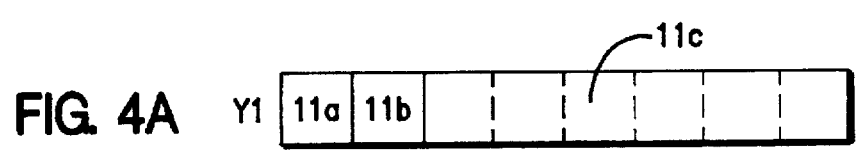
FIG. 4 gives column address configuration diagrams showing the start address and the end address of this embodiment mode.
Figure 4B:
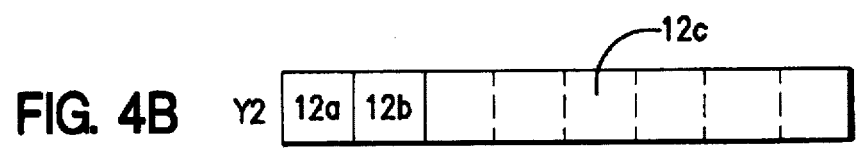
Figure 5A:
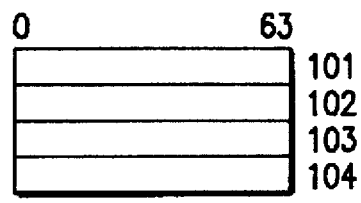
FIG. 5 gives explanatory diagrams showing schematically the configurations of the display regions corresponding to one row address.
Figure 5B:
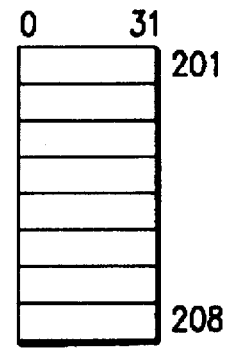
Figure 6A:
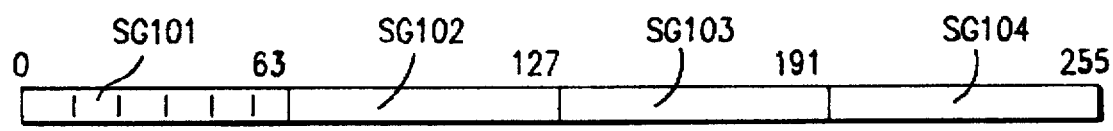
FIG. 6 gives explanatory diagrams schematically showing the memory conditions according to the conventional graphic memory write method.
Figure 6B:
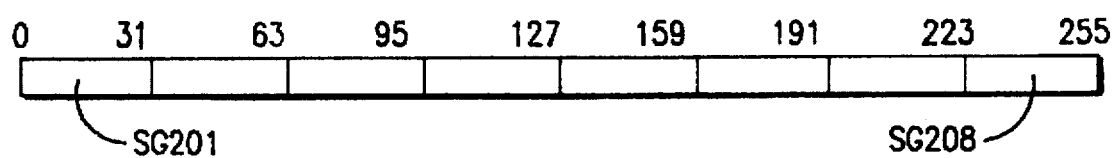

For the case of the block A1, since the column address for the start address is "11100000" and the column address for the end address is "11111111", the start addresses for respective segments are designated as "100000" (locations indicated by the letter S in FIG. 2A–2J) from the low bits Y1c of the column address for the start address, and the end addresses for respective segments are designated as "111111" (locations indicated by the letter E in FIG. 2A–2J) from the low order bits Y2c of the column address for the end address. The areas (section between S and E) designated by the low order bits Y1c of the column address for the start address and the low order bits Y2c of the column address for the end address serve as candidates for the write object areas. Next, since the high order two bits of the column address for the start address are "11" and the high order two bits of the column address for the end address are also "11", the segment designated by both sets of the two bits is SG4. Accordingly, data write is carried out by taking the candidate for the write object area of the segment SG4 (hatched portion in FIG. 2A–2J) of the actual memory area MA1 as the write object area K1.

The actual memory area MA2 corresponding to the block A2 has "000000" and "111111" as the low order bits Y1c and Y2c of the start and end addresses, respectively. Since the designation of the high order two bits of the start and end addresses are "11" for both, the segment SG4 is designated, and data write is carried out to a write object area K2 of the actual memory area MA2.

The actual memory area MA3 corresponding to the block A3 has "000000" and "010000" as the low order bits of the start and end addresses, respectively. Since both of the high order two bits of the start and end addresses are "11", the segment SG4 is designated, and data write is carried out to a write object area K3 of the actual memory area MA3.

The actual memory areas MA4 and MA7 corresponding to the blocks A4 and A7, respectively, have "100000" and "111111" as respective low order bits for the start and end addresses. Since the designations of the high order two bits of the start and end addresses are "00" and "11", respectively, the segments SG1 and SG4, and the segments SG2 and SG3 lying between the segments SG1 and SG4 are designated, and data write is carried out to write object areas K4 of the actual memory areas MA4 and MA7.

The actual memory areas MA6 and MA9 corresponding to the blocks A6 and A9, respectively, have "000000" and "010000" as respective low order bits for the start and end addresses. Since the designations of the high order two bits of the start and end addresses are "00" and "11", respectively, the segments SG1, SG2, SG3 and SG4 are designated, and data write is carried out to write object areas K5 of the actual memory areas MA6 and MA9.

The actual memory area MA10 corresponding to the block A10 has the low order bits for the start and end addresses that are the same as for the memory areas MA4 and MA7. Since the high order two bits of the start and end addresses are "00" and "10", respectively, segments SG1, SG2 and SG3 are designated, and data write is carried out to a write object areas K6 of the actual memory area MA10.

The actual memory area corresponding to the block A11 has "000000" and "111111" as the low order bits of the start and end addresses, respectively, and has values identical to those of the block A10 for the high order two bits of the start and end addresses, so that data write is carried out to write object areas K7 of the actual memory area MA11.

The actual memory area MA12 corresponding to the block A12 has values of the low order bits of the start and end addresses that are identical to the values for the memory areas MA6 and MA9, and values of the high order two bits of the start and end addresses that are identical to the values for the memory areas MA10 and MA11, so that data write is carried out to write object areas K8 of the actual memory area MA12.

The actual memory areas MA5 and MA8 corresponding to the blocks A5 and A8, though not shown, can be found to have write object areas for the entire areas of the actual memory areas MA5 and MA8 by the same procedures as in the above. It is to be noted that at least one of the start and end addresses of the actual memory areas MA1 to MA12 of the area 1 has boundaries that coincide with the boundaries of the segments corresponding to one row address. However, no problem will be generated even if none of the boundaries of the start and end addresses of the actual memory areas, such as those of the memory areas MA13 and MA14 of the area 2, coincide with the boundaries of the segments.

In this way, the number of simultaneously writable addresses becomes, at the most, equal to the number of column addresses that exists corresponding to one row address. For example, writing to rectangular areas with an arbitrary length up to 256 pixels as in the blocks A5 and A8 become possible. In this case, a performance with a speed as high as 32 times that of the block write method for the simultaneous write of 8 columns can be obtained.

The present invention can be modified in various ways within the range which does not change the scope of the invention. For example, the case of dividing the column addresses corresponding to one row address into four segments has been described in the above, but the invention will not be changed essentially even if the column addresses are divided into 2, 8 or more segments. The method of division of the column addresses will now be described. If the numbers of the high order bits and the low order bits of the column address for the start address and the column address for the end address are set to be 3 and 5, respectively, the column addresses are divided into 8 segments, with the column address number of each segment being 32. Similarly, if the numbers of the high order bit and the low order bits are 1 and 7, respectively, the number of divided segments is 2, with the column address number of each segment being 128. Further, in the present embodiment, the number of input terminal of CAS is set to be 1, and the column address for the start address and the column address for the end address are input by time division, but a CAS input terminal for the start address and a CAS input terminal for the end address may be introduced instead.

As described in the above, the write method according to the present invention includes the step of dividing the area of the entire column addresses of a memory cell array designated by one row address into a plurality of segments with an arbitrary length, and the step of designating the start address and the end address of the write object area. Therefore, the number of simultaneously writable addresses becomes, at the most, equal to the number of column addresses corresponding to one row address, and the write to rectangular areas becomes possible without increasing the number of terminals compared with the conventional block write method, thereby bringing about an effect of drastically improving the high speed operability of the method.

What is claimed is:

1. A write method to a graphic memory comprising:
    a first step of dividing the area corresponding to the column addresses designated by one row address of a memory cell array into a plurality of segments each consisting of an arbitrary number of column addresses;
    a second step of designating a start address and an end address for each of said plurality of segments based on a first piece of information of column address information;
    a third step of specifying the section designated by said start address and said end address as candidates for write object areas; and
    a fourth step of selecting segments having write object areas based on a second piece of information of said column address information and writing specified data to said candidates for write object areas of segments having the write object areas.

2. A write method to a graphic memory as claimed in claim 1, wherein said column address information comprises a column address for start address consisting of first bits and second bits and a column address for end address consisting of third bits and fourth bits and said start address and said end address are designated by said first bits and said third bits.

3. A write method to a graphic memory as claimed in claim 2, wherein said second piece of information consists of said second bits and said fourth bits, segments are respectively designated by said second bits and said fourth bits, and the designated segments and the segments lying between these designated segments are specified as the segments having said write object areas.

* * * * *